United States Patent
Shibazaki

(10) Patent No.: US 10,474,044 B2
(45) Date of Patent: Nov. 12, 2019

(54) MOVABLE BODY APPARATUS, EXPOSURE APPARATUS, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/181,689

(22) Filed: Nov. 6, 2018

(65) Prior Publication Data

US 2019/0079415 A1    Mar. 14, 2019

Related U.S. Application Data

(63) Continuation of application No. 14/432,513, filed as application No. PCT/JP2013/076819 on Oct. 2, 2013, now Pat. No. 10,133,194.

(30) Foreign Application Priority Data

Oct. 2, 2012 (JP) ................. 2012-219946

(51) Int. Cl.
*G03F 7/20* (2006.01)
*H02K 41/03* (2006.01)
*H02K 7/08* (2006.01)

(52) U.S. Cl.
CPC ...... *G03F 7/70758* (2013.01); *G03F 7/70716* (2013.01); *G03F 7/70808* (2013.01); *G03F 7/70816* (2013.01); *H02K 7/08* (2013.01); *H02K 41/03* (2013.01); *H02K 41/031* (2013.01); *H02K 2201/18* (2013.01)

(58) Field of Classification Search
CPC ............. G03F 7/70716; G03F 7/70758; G03F 7/70816
See application file for complete search history.

(56) References Cited

U.S. PATENT DOCUMENTS

| 3,376,578 A | 4/1968 | Sawyer |
| 4,654,571 A | 3/1987 | Hinds |

(Continued)

FOREIGN PATENT DOCUMENTS

| JP | 2001-102429 A | 4/2001 |
| JP | 2007-215264 A | 8/2007 |

(Continued)

OTHER PUBLICATIONS

Nov. 26, 2013 Search Report issued in International Patent Application No. PCT/JP2013/076819.

(Continued)

*Primary Examiner* — Steven Whitesell Gordon
(74) *Attorney, Agent, or Firm* — Oliff PLC

(57) ABSTRACT

A stage device is equipped with a surface plate and a wafer stage which is mounted on the surface plate and has an exhausting port formed on a surface facing the surface plate. In a state where the wafer stage lands on the surface plate, an air chamber is formed in between the surface plate and the wafer stage. Pressurized gas blows out from the exhausting port provided at a stage main section into the air chamber, and self-weight of the wafer stage is cancelled by an inner pressure of the air chamber. This allows to the wafer stage which has stopped on the surface plate to be moved manually.

13 Claims, 8 Drawing Sheets

(56) References Cited

U.S. PATENT DOCUMENTS

| | | | |
|---|---|---|---|
| 5,664,318 A * | 9/1997 | Fuchs | H02K 41/03 |
| | | | 29/593 |
| 6,339,266 B1 * | 1/2002 | Tanaka | B23Q 5/28 |
| | | | 310/12.06 |
| 6,351,041 B1 | 2/2002 | Okubo | |
| 6,408,767 B1 | 6/2002 | Binnard et al. | |
| 6,417,914 B1 | 7/2002 | Li | |
| 6,452,292 B1 | 9/2002 | Binnard | |
| 6,611,316 B2 | 8/2003 | Sewell | |
| 6,778,257 B2 | 8/2004 | Bleeker et al. | |
| 7,023,610 B2 | 4/2006 | Ohtsuki et al. | |
| 7,205,741 B2 * | 4/2007 | Simons | G03F 7/70725 |
| | | | 318/560 |
| 8,004,650 B2 | 8/2011 | Hirukawa | |
| 2003/0025890 A1 | 2/2003 | Nishinaga | |
| 2008/0252865 A1 * | 10/2008 | Nagasaka | G03F 7/70341 |
| | | | 355/30 |
| 2009/0268178 A1 | 10/2009 | Shibazaki | |
| 2009/0316133 A1 | 12/2009 | Shibazaki | |
| 2010/0066992 A1 | 3/2010 | Ono | |

FOREIGN PATENT DOCUMENTS

| | | | |
|---|---|---|---|
| JP | 4352445 B2 | 10/2009 | |
| JP | 2011-165990 A | 8/2011 | |
| WO | 01/35168 A1 | 5/2001 | |

OTHER PUBLICATIONS

Nov. 26, 2013 Written Opinion of the International Searching Authority issued in International Patent Application No. PCT/JP2013/076819.
Jul. 20, 2016 Office Action issued in U.S. Appl. No. 14/432,513.
Dec. 5, 2016 Office Action issued in U.S. Appl. No. 14/432,513.
Jan. 2, 2017 Search Report issued in European Patent Application No. 13843307.1.
Mar. 23, 2017 Office Action issued in Chinese Patent Application No. 201380060751.6.
Human Translation of Japanese Patent Application No. 2011-165990.
Human Translation of Japanese Patent Application No. 2007-215264.
Jun. 6, 2017 Office Action issued in U.S. Appl. No. 14/432,513.
Sep. 4, 2017 Office Action issued in Japanese Patent Application No. 2014-539782.
Dec. 18, 2017 Office Action issued in U.S. Appl. No. 14/432,513.
Apr. 17, 2018 Office Action issued in Japanese Patent Application No. 2014-539782.
Jul. 8, 2019 Extended European Search Report issued in European Application No. 19152519.5.

* cited by examiner

MOVABLE BODY APPARATUS, EXPOSURE APPARATUS, AND DEVICE MANUFACTURING METHOD

This is a Continuation of U.S. application Ser. No. 14/432,513 filed Jun. 24, 2015, which is a National Stage Application of International Application No. PCT/JP2013/076819 filed Oct. 2, 2013, which claims the benefit of Japanese Application No. 2012-219946 filed Oct. 2, 2012. The disclosures of the prior applications are hereby incorporated by reference herein in their entireties.

TECHNICAL FIELD

The present invention relates to movable body apparatuses, exposure apparatuses and device manufacturing methods, and more particularly to a movable body apparatus including a movable body driven on a base member by a magnetic levitation type planar motor, an exposure apparatus equipped with the movable body apparatus and a device manufacturing method which uses the exposure apparatus.

BACKGROUND ART

Conventionally, in a lithography process to manufacture electronic devices (microdevices) such as a semiconductor device (such as an integrated circuit) or a liquid crystal display device, exposure apparatuses such as a projection exposure apparatus (a so-called stepper) of a step-and-repeat method or a projection exposure apparatus (so-called scanning stepper (also called a scanner)) of a step-and-scan method is mainly used.

This type of exposure apparatus is equipped with a substrate stage which moves on a stage base (hereinafter briefly shortened to a base, as appropriate), holding a substrate such as a wafer or a glass plate which serves as an exposure subject. As a driving source of this substrate stage, a substrate stage device is known which uses a planar motor including a mover that the substrate stage has and a stator that the stage base has (for example, refer to PTL 1).

In the planar motor used as the driving source of the substrate stage, there is an air flotation method in which the stage is levitated on the base by an air bearing and a magnetic levitation method according to PTL 1 described above in which the stage is levitated on the base by a magnetic levitation force generated by the planar motor. In the planar motor, there s a moving-magnet-type in which the mover includes a magnet and the stator includes a coil and a moving-coil-type in which the mover includes the coil and the stator includes the magnet. However, because it is not preferable for the stage to drag wiring and the like, in the substrate stage device, the moving-magnet-type planar motor is mainly employed.

Here, the case will be considered when the planar motor serving as the driving source of the substrate stage does not or cannot generate a driving force, such as when a breakdown of some kind occurs like the coil and/or a motherboard being damaged, or at the time of manufacturing or maintenance. In such a case, to move the substrate stage, in a substrate stage device that employs the planar motor of the magnetic levitation method, the substrate stage has to be lifted by human power, which is different from the planar motor of air flotation method where the levitated state of the substrate stage can be maintained by static pressure (so-called pressure in bearing clearance) of high-pressure air in between the bearing surface of the air bearing and the base upper surface. However, because the latest substrate stage weighs, for example, as much as 150 kg, the substrate stage cannot be lifted and moved alone by human power. If there is enough work space, while the substrate stage can be moved by several people working together, if there is not enough work space the substrate stage virtually cannot be moved. Therefore, as a method for overcoming this, while a proposal can be considered of providing wheels in a substrate stage via a vertical movement mechanism, in this case, the upper surface of the stator (base) has to be flat and also hard to some extent. However, because the stator upper surface of the moving-magnet-type planar motor that employs the magnetic levitation method is not so hard, microchannels on the stator side may be damaged by point load given via the wheels.

CITATION LIST

Patent Literature

[PTL 1] U.S. Pat. No. 6,452,292

SUMMARY OF INVENTION

Solution to Problem

The present invention was made under the circumstances described above, and according to a first aspect, the present invention is a movable body apparatus, comprising: a base member; a movable body placed on the base member that is movable two-dimensionally on the base member; and a planar motor of a magnetic levitation method which drives the movable body on the base member, the motor having a stator provided at the base member and a mover provided at the movable body, wherein the movable body has a movable body main section, a frame-shaped member having a lower surface facing the base member of the movable body main section in which a surface provided at the periphery of the mover facing the base member is flush with other portions including the mover or protrudes to a side of the base member than the other portions, and an exhausting port which is provided at the movable body main section that blows out pressurized gas supplied from the outside toward the base member.

According to this apparatus, of the lower surface facing the base member of the movable body main section, when the lower surface of the frame-shaped member provided at the periphery of the mover comes into contact with the upper surface of the base member, a closed space which becomes a substantially air-tight state to the outside is formed by the upper surface of the base member, the lower surface of the movable body main section, and the frame-shaped member. Then, the pressurized gas supplied from the outside blowing out toward the base member via the exhausting port creates positive pressure in the closed space with respect to the outside, and at least a part of the weight of the movable body (a force in a vertically downward direction which is equivalent to mass×gravitational acceleration) is canceled (canceled out) by the pressure of the pressurized gas which is supplied. This, for example, allows the movable body to be moved manually on the base member, even in a state when generation of the driving force (including the levitation force) to the movable body by the planar motor is stopped.

According to a second aspect of the present invention, the invention is an exposure apparatus, comprising: the movable body apparatus described above in which a predetermined object is held by the movable body; and a pattern formation apparatus which forms a predetermined pattern by irradiating an energy beam on the object.

According to a third aspect of the present invention, the invention is a device manufacturing method, comprising: exposing the object using the exposure apparatus of the present invention; and developing the object that has been exposed.

BRIEF DESCRIPTION OF DRAWINGS

FIG. 5A shows a retracted state of each driving wheel, and FIG. 5B shows a landed state of each driving wheel.

DESCRIPTION OF EMBODIMENTS

Hereinafter, an embodiment will be described, according to FIGS. 1 to 7.

Figure 1:
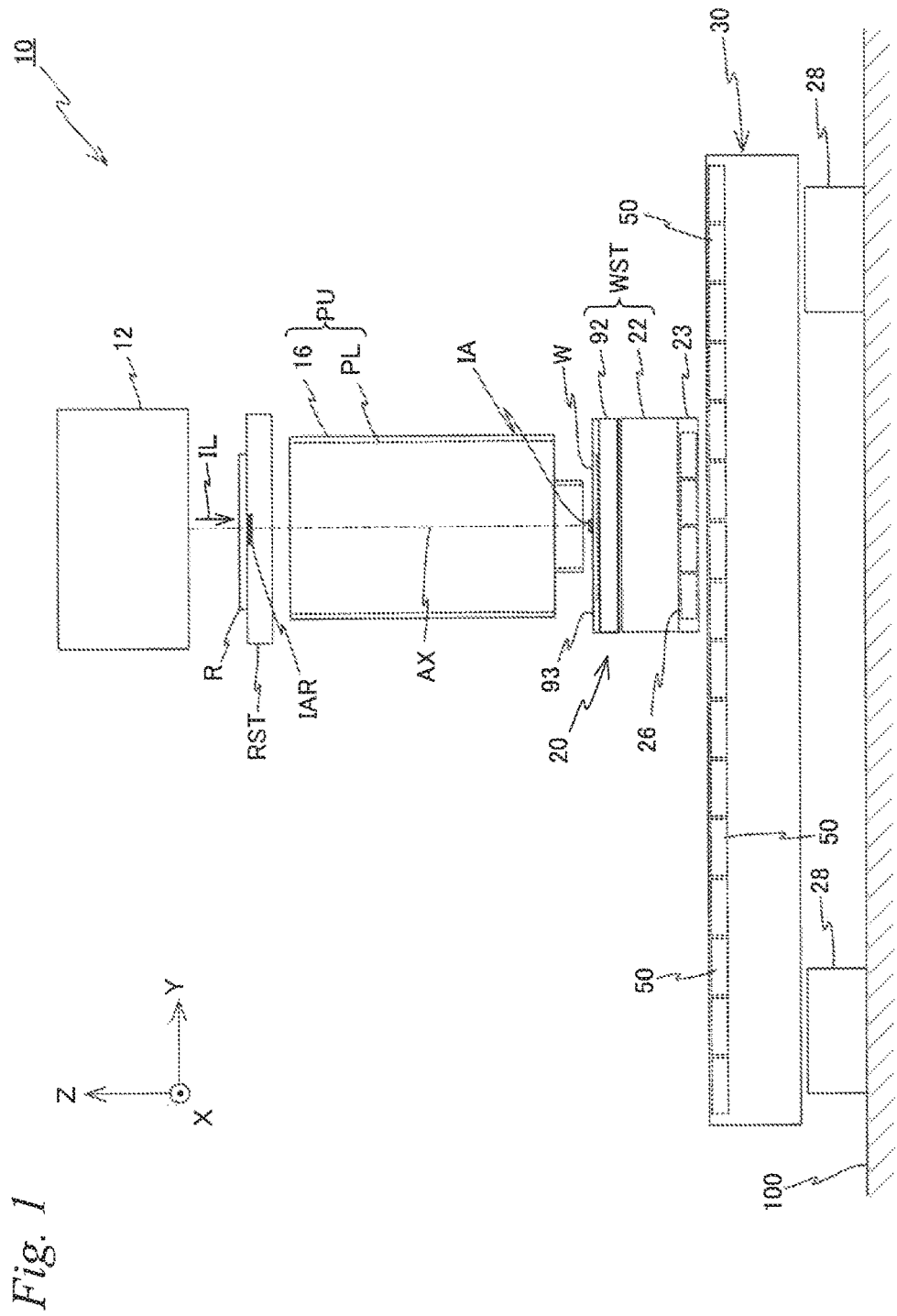
FIG. 1 is a view schematically showing a structure of an exposure apparatus related to an embodiment.

FIG. 1 schematically shows a structure of an exposure apparatus 10 related to an embodiment. Exposure apparatus 10 is a scanning type exposure apparatus of a step-and-scan method, or a so-called scanner. As it will be described later on, a projection optical system PL is provided in the present embodiment, and in the description below, a direction parallel to an optical axis AX of this projection optical system PL will be described as a Z-axis direction, a direction orthogonal to the Z-axis direction where reticle R and wafer W are relatively scanned will be described as a Y-axis direction and a direction orthogonal to the Z-axis and the Y-axis will be described as an X-axis direction, and rotation (tilt) directions around an X-axis, a Y-axis and a Z-axis will be described as θx, θy and θz directions, respectively.

Exposure apparatus 10 is equipped with an illumination system 12, a reticle stage RST holding a reticle R illuminated by an exposure illumination light (hereinafter shortly referred to as illumination light) IL from illumination system 12 that is moved in a predetermined scanning direction (here, in the Y-axis direction which is a lateral direction of the page surface in FIG. 1), a projection unit PU including projection optical system PL which projects illumination light IL outgoing from reticle R on wafer W, a wafer stage device 20 including a wafer stage WST on which a wafer W is mounted and a control system for these parts.

Here, in exposure apparatuses such as a scanner, normally, while components of each section described above except for the light source and the control system which will be described later on are retracted in an environment control chamber whose temperature, pressure and the like inside are maintained almost constant, description related to the chamber will be omitted below.

Illumination system 12 includes a light source and an illumination optical system which has an illuminance equalizing optical system including an optical integrator and the like and a reticle blind and the like (both of which are not shown), as is disclosed in, for example, U.S. Patent Application Publication No. 2003/0025890 and the like. Illumination system 12 illuminates a slit-shaped illumination area IAR set (limited) by the reticle blind (also called a masking system) on reticle R with illumination light (exposure light) IL at an almost uniform illuminance. Here, as illumination light IL, for example, an ArF excimer laser beam (wavelength 193 nm) is used.

Reticle stage RST holds reticle R, which has a circuit pattern and the like formed on its pattern surface (a surface on the −Z side in FIG. 1), for example, by vacuum chucking. Reticle stage RST can be driven in predetermined strokes in a scanning direction (the Y-axis direction), and can be finely driven in the X-axis and the θz directions by a reticle stage driving system 13 (not shown in FIG. 1, refer to FIG. 6) which includes, for example, a linear motor and the like. Positional information (including rotation quantity information in the θz direction) within an XY plane of reticle stage RST is constantly measured at a predetermined resolution, for example, at a resolution of around 0.25 nm, by a reticle stage position measurement system 15 (not shown in FIG. 1, refer to FIG. 6) including, for example, a laser interferometer system (or an encoder system), and its measurement values are sent to a main controller 90 (refer to FIG. 6). Main controller 90 controls the position (and velocity) of reticle stage RST in the X-axis direction, the Y-axis direction and the θz direction (rotation direction around the Z-axis), via reticle stage driving system 13 (refer to FIG. 6) based on the measurement values of reticle stage position measurement system 15.

Projection unit PU is placed below reticle stage RST (−Z side). Projection unit PU includes a barrel 16 and projection optical system PL held inside barrel 16. As projection optical system PL, for example, a dioptric system is used, consisting of a plurality of optical elements (lens elements) arranged along optical axis AX. Projection optical system PL is, for example, double telecentric, and has a predetermined projection magnification (such as, for example, 1/4 times, 1/5 times or 1/8 times).

Therefore, when illumination area IAR on reticle R is illuminated by illumination light IL from illumination system 12, by illumination light IL having passed through reticle R which is placed so that its pattern surface almost coincides with a first plane (object plane) of projection optical system PL, a reduced image (a reduced image of a part of the circuit pattern) of the circuit pattern of reticle R within illumination area IAR is formed via projection optical system PL, in an area (hereinafter also called an exposure area) IA conjugate to illumination area IAR that is on wafer W whose surface is coated with a resist (sensitive agent) placed on a second plane (image plane) side of projection optical system PL. And, by synchronous driving of reticle stage RST and wafer stage WST, scanning exposure of a shot area (divided area) on wafer W is performed and the pattern of reticle R is transferred onto the shot area, by reticle R relatively moving in the scanning direction with respect to illumination area IAR (illumination light IL) while wafer W relatively moves in the scanning direction with respect to exposure area IA (illumination light IL). That is, in the present embodiment, the pattern of reticle R is generated on wafer W by illumination system 12 and projection optical system PL, and the pattern is formed on wafer W by exposure of a sensitive layer (resist layer) on wafer W with illumination light IL.

Wafer stage device 20, as is shown in FIG. 1, is equipped with a surface plate 30 and wafer stage WST. Wafer stage device 20, furthermore, is equipped with a wafer stage driving system 27 (refer to FIG. 6) which drives wafer stage WST and a wafer stage position measurement system 25 (refer to FIG. 6) which measures the position of wafer stage WST.

Surface plate 30 has an outer shape which a rectangular plate shape (refer to FIG. 2) that has a longitudinal direction in the Y-axis direction in a planar view (when viewed from a +Z direction), and is supported in a non-contact manner from below by a plurality of support devices 28 so that its upper surface is substantially parallel to an XY plane (a horizontal plane). The plurality of support devices 28 provided, for example, is four so that the vicinity of the four corners of surface plate 30 can be supported (two support devices 28 placed on the −X side is hidden in the depth side of the page surface in FIG. 1). Support device 28 is structured substantially similar to an anti-vibration device disclosed in, for example, U.S. Patent Application Publication No. 2009/0316133, and restrains vibration from travelling mutually between surface plate 30 and a floor 100 (refer to FIG. 1). In an upper part of surface plate 30, a stator 50 of a planar motor to be described later on is retracted which structures wafer stage driving system 27.

Wafer stage WST, as is shown in FIG. 1, is equipped with a wafer stage main section 22 and a wafer table 92 fixed on wafer stage main section 22.

Figure 3:
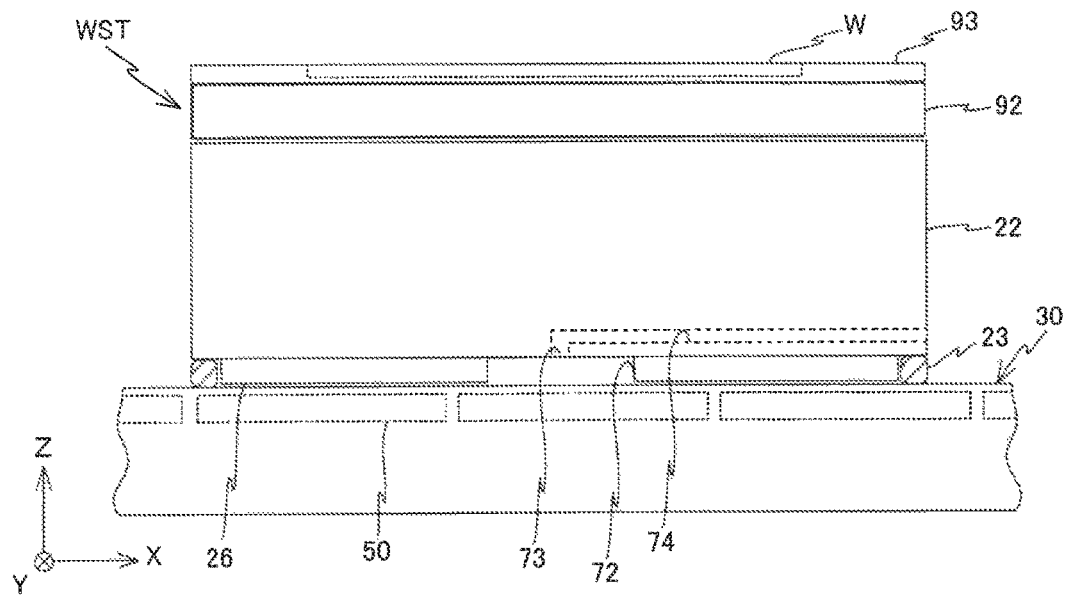
FIG. 3 is a side view of the wafer stage device in FIG. 2.

Wafer stage main section 22 consists of a rectangular parallelepiped member as is shown in FIG. 3, and a mover 26 that structures the planar motor along with stator 50 described above is fixed to its bottom surface (lower surface) substantially parallel to the XY plane. Details on the structure and the like of wafer stage main section 22 will be described furthermore later in the description.

In wafer table 92, a wafer holder (not shown), for example, of a pin chuck method that holds wafer W by vacuum chucking and the like, and a plate 93 (refer to FIGS. 1 to 3) that has a circular opening formed slightly larger than the outer diameter of the wafer holder, or to be more specific, larger from around 0.1 to 2 mm than the diameter of wafer W mounted and held by suction on the wafer holder, are equipped. The wafer holder has a circular plate-like main section, an annular projecting section (rim section) provided at a projecting manner on the upper surface of the main section that has an outer diameter slightly smaller than the diameter of wafer W, and multiple pins placed on the upper surface of the main section on an inner side of the projecting section at a predetermined spacing. Then, in a state supported by the multiple pins and the projecting section, wafer W is vacuum chucked by the wafer holder. In this case, in the state where wafer W is vacuum chucked, the wafer W surface and the surface of plate 93 are almost at the same height. That is, the upper surface of wafer table 92 includes the upper surface of wafer W, and a surface is formed that appears to be completely flat. Therefore, wafer table 92 related to the present embodiment is also suitable for the so-called liquid immersion exposure apparatus. However, in the case exposure apparatus 10 is not a liquid immersion type apparatus, the upper surface of wafer W and the surface of plate 93 do not have to be at the same height.

Wafer stage driving system 27 (refer to FIG. 6) includes a moving-magnet-type planar motor of the magnetic levitation method including mover 26 fixed to a lower surface of wafer stage main section 22 and stator 50 retracted in the upper part of surface plate 30 that uses as its driving force an electromagnetic force (Lorentz force) generated by an electromagnetic interaction between mover 26 and stator 50. In the description below, for the sake of convenience, this planar motor will be expressed as a planar motor 27, using the same reference sign as wafer stage driving system 27.

Figure 4:
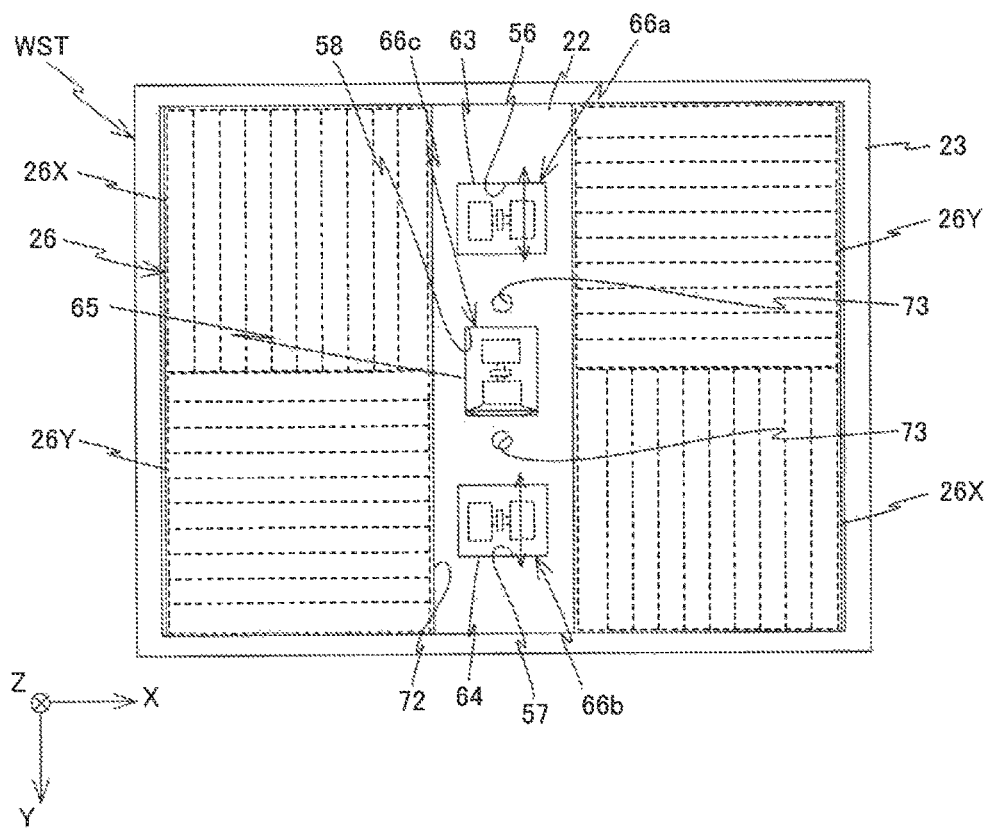
FIG. 4 is a bottom surface view of the wafer stage device in FIG. 2.

Mover 26, as is shown in FIG. 4, consists of two each of X magnet units 26X and Y magnet units 26Y that are fixed to the lower surface of wafer stage main section 22. As is shown in FIG. 4, when the center of the wafer stage WST lower surface serves as an origin point, the two X magnet units 26X are placed, respectively, on the +X side and the +Y side (a first quadrant) and on the −X side and the −Y side (a third quadrant) with respect to the origin point, and the two Y magnet units 26Y are placed, respectively, on the −X side and the +Y side (a second quadrant) and on the +X side and the −Y side (a fourth quadrant) with respect to the origin point. However hereinafter, X magnet units 26X and Y magnet units 26Y will be referred to collectively as magnet unit 26, appropriately, using the same reference sign as mover 26.

The four magnet units 26 are placed with almost no clearance in between in the Y-axis direction, and with a predetermined clearance 72 in the X-axis direction.

X magnet unit 26X is structured from a plurality of magnets having a rectangular solid shape longitudinal in the Y-axis direction that are arranged at a predetermined pitch in the X-axis direction. These plurality of magnets are arranged so that polarity of their magnetic pole surfaces parallel to the XY plane alternately becomes a reversed polarity. Similarly, Y magnet unit 26Y is structured from a plurality of magnets having a rectangular solid shape longitudinal in the X-axis direction that are arranged at a predetermined pitch in the Y-axis direction. These plurality of magnets are arranged so that polarity of their magnetic pole surfaces parallel to the XY plane alternately becomes a reversed polarity. Adjacent magnets in each X magnet unit 26X and Y magnet unit 26Y, can be arranged in contact, or arranged apart via a predetermined clearance.

Figure 2:
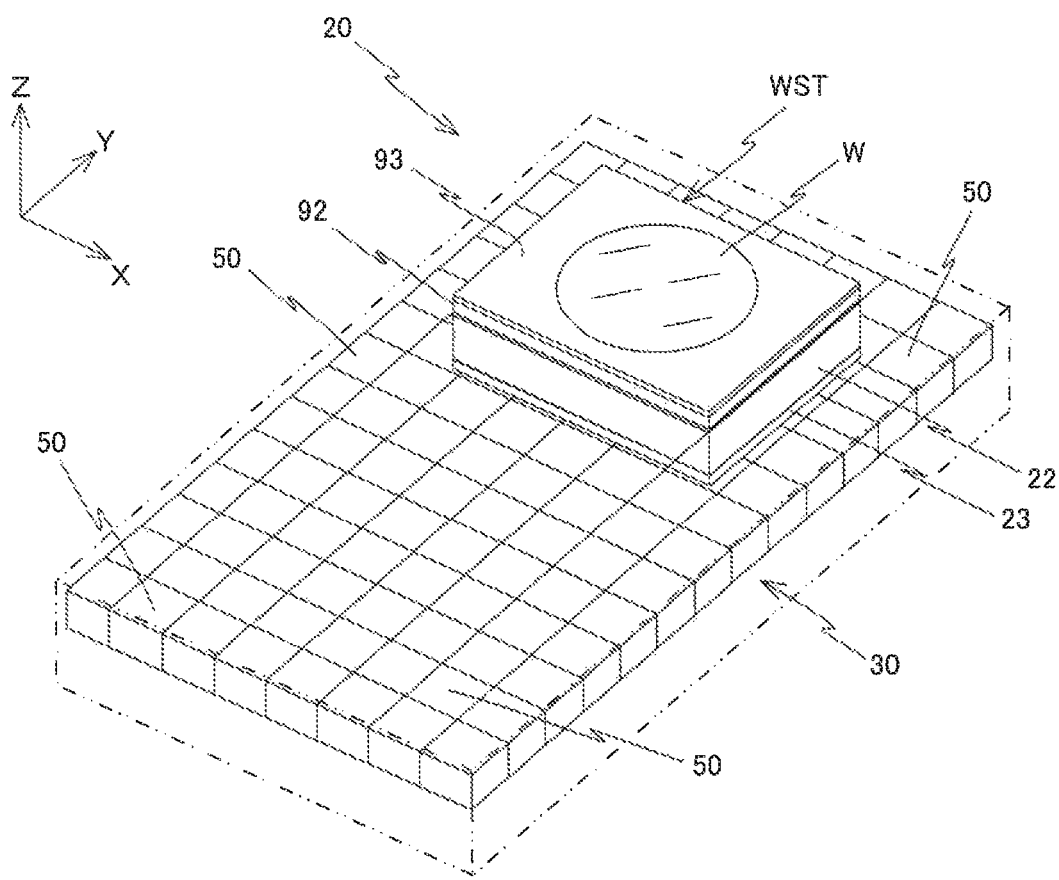
FIG. 2 is a perspective view of a wafer stage device that the exposure apparatus in FIG. 1 has.

Stator 50, as is shown simplified in FIGS. 1 and 2, consists a plurality of coil units (hereinafter referred to as coil unit 50, using the same reference sign as stator 50) which are placed in a regular manner so that the coil units are adjacent to one another in the X-axis and the Y-axis directions (in a matrix). To each of the plurality of coil units 50, a mother board or the like which is not shown is connected that distributes electric power, electric signal and the like to each coil unit 50.

The plurality of coil units 50 each has a plurality of rectangular parallelepiped shapes which are almost a square in a planar view. Each coil unit 50, for example, can be structured by a two-layer coil which includes an X coil unit including three X coils having a longitudinal direction in the Y-axis direction that are placed adjacent to one another in the X-axis direction, and a Y coil unit including three Y coils having a longitudinal direction in the X-axis direction that are placed adjacent to one another in the Y-axis direction that is layered on the X coil unit. X coil unit and Y coil unit each have a shape which is almost a square in a planar view.

When a three-phase alternating current is supplied to the plurality of X coil units the lower section of stator 50, an electromagnetic force (Lorentz force) in the X-axis direction and the Z-axis direction is generated in (the X coils structuring) the X coil unit that faces mover 26, and a reaction force of the electromagnetic force becomes a driving force for driving wafer stage WST in the X-axis direction and the Z-axis direction. When a three-phase alternating current is supplied to the plurality of Y coil units in the upper section of stator 50, an electromagnetic force (Lorentz force) in the Y-axis direction and the Z-axis direction is generated in (the Y coils structuring) the Y coil unit that faces mover 26, and a reaction force of the electromagnetic force becomes a driving force for driving wafer stage WST in the Y-axis direction and the Z-axis direction. Incidentally, the structure of stator 50 is not limited to this, and can be structured, for example, with a plurality of square-shaped coils placed in a matrix, and in this case, the magnet unit structuring mover 26 should also have its magnets placed corresponding to the structure.

Figure 6:
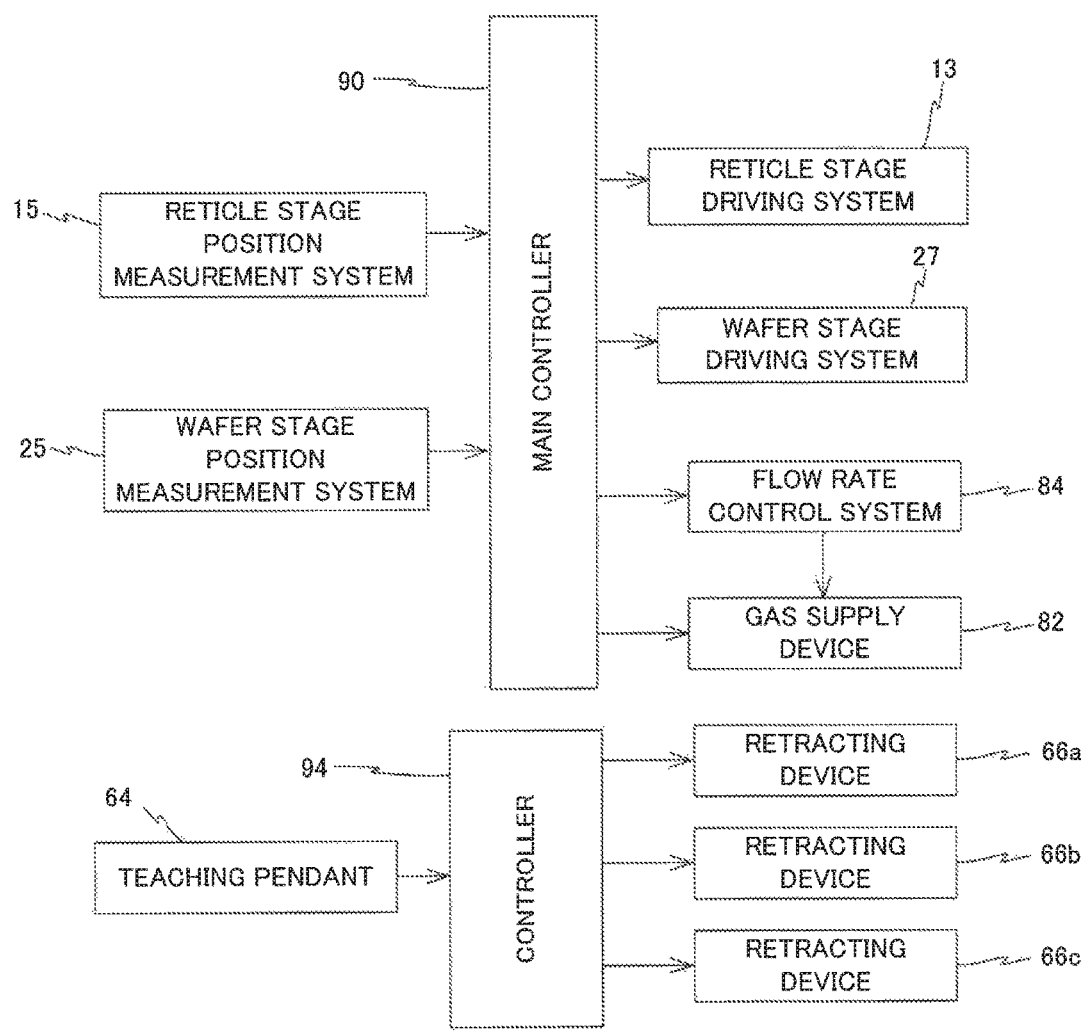
FIG. 6 is a block diagram showing an input/output relation of a main controller that chiefly structures a control system of an exposure apparatus related to an embodiment and has overall control over each section.

In any case, as planar motor 27, a so-called 6DOF (degrees of freedom) driving type planar motor as is disclosed in, for example, U.S. Pat. No. 6,452,292 that can appropriately drive wafer stage WST in directions of six degrees of freedom (the X-axis direction, the Y-axis direction, the Z-axis direction, the θx direction, the θy direction, and the θz direction) with respect to surface plate 30 by the electromagnetic force (Lorentz force) described above is used. This allows main controller 90 (not shown in FIG. 1. Refer to FIG. 6) to drive wafer stage WST in predetermined long strokes in the X-axis direction, and/or the Y-axis direction (along the XY plane) on surface plate 30, to levitate (magnetically levitate) wafer stage WST on surface plate 30 via a predetermined clearance (gap, clearance), and to finely drive wafer stage WST which moves along the XY plane appropriately in a pitching direction (θx direction), a yawing direction (θz direction), and a rolling direction (θy direction), using planar motor 27, or in other words, wafer stage driving system 27 (refer to FIG. 6).

Positional information within the XY plane (including rotation quantity information in the θz direction) of wafer stage WST is obtained by main controller 90 (refer to FIG. 6) using wafer stage position measurement system 25 (not shown in FIG. 1. Refer to FIG. 6) which includes, for example, a two-dimensional (or a three-dimensional) encoder system, or an optical interferometer system (or a combined system of the encoder system and the optical interferometer system). Incidentally, the structure of wafer stage position measurement system 25 is not limited in particular, as long as positional information of wafer stage WST in 6DOF directions can be obtained at a desired resolution.

Here, in the case a driving force parallel to the horizontal plane (the X-axis, and/or the Y-axis direction) is made to act on wafer stage WST on surface plate 30 using planar motor 27, a reaction force of the driving force described above acts on surface plate 30 in a direction opposite to wafer stage WST within the horizontal plane. And, because surface plate 30 is supported in a non-contact manner by the plurality of support devices 28, surface plate 30 absorbs the reaction force described above by moving in the direction opposite to wafer stage WST due to the law of conservation of momentum within the horizontal plane, which suppresses generation of vibration and the like caused by the reaction force described above. Incidentally, since the weight of surface plate 30 is greater than the weight of wafer stage WST, the moving amount of surface plate 30 is very small when compared to wafer stage WST. Further, wafer stage device 20 has a plurality of so-called trim motors (not shown) to make surface plate 30 which was moved by the reaction force described above return to a predetermined position.

Returning back to FIG. 3, to an outer circumference section of the lower surface of wafer stage main section 22, a rectangular frame-shaped member 23 is fixed (only a cross-section of frame-shaped member 23 is shown in FIG. 3) in a state surrounding mover 26 (four magnet units). Frame-shaped member 23 has its lower surface set at almost the same height position or slightly lower than a lower surface (or, in the case a protective member (such as, for example, a protective film made of Teflon (registered trademark)) is provided on the lower surface of mover 26, a lower surface of the protective member) of mover 26 (four magnet units), and its upper surface is fixed to the lower surface of wafer stage main section 22. That is, in the case wafer stage WST lands on surface plate 30, the entire surface of the lower surface of frame-shaped member 23 (or the protective member) comes into contact with the upper surface of surface plate 30 upper surface. In this case, the lower surface of wafer stage main section 22, an inner periphery of frame-shaped member 23, and the upper surface of surface plate 30 form a closed space which is in a substantially air-tight state from the outside. Hereinafter, this closed space will be referred to as an air chamber 72, using the same reference sign as clearance 72.

On the lower surface of wafer stage main section 22, one each of an exhausting port 73 is formed on one side and the other side in the Y-axis direction with the center point in between (refer to FIG. 4). Further, inside wafer stage main section 22, a pipeline 74 is provided that has one end opening at a side surface of wafer stage main section 22 and the other end branching into two in which exhausting port 73 is provided, respectively, at the tip of each branch. A structure is employed where to the one end of pipeline 74, for example, one end of a piping member not shown which has the other end connected to a gas supply device 82 (not shown in FIG. 3, refer to FIG. 6) consisting of a compressor connected in a freely detachable manner. That is, gas supply device 82 can be connected to wafer stage main section 22 in a freely detachable manner, via the piping member which is not shown.

In a state where gas supply device 82 is connected to wafer stage main section 22 via the piping member which is not shown, pressurized gas (for example, high-pressure air) supplied from gas supply device 82 via the piping member blows out from each of the two exhausting ports 73 via pipeline 74. Main controller 90 (refer to FIG. 6) cancels out (cancels) at least a part of the weight (a downward force in the vertical direction) of wafer stage main section 22 by turning pressure of pressurized gas within air chamber 72 into positive pressure with respect to space outside of air chamber 72, in the state previously described where air chamber 72 is formed. Flow rate and the like of the gas sent from gas supply device 82 to the inside of air chamber 72 are controlled by a flow rate control system 84 (not shown in FIG. 3, refer to FIG. 6) via main controller 90 (refer to FIG. 6).

Figure 5A:
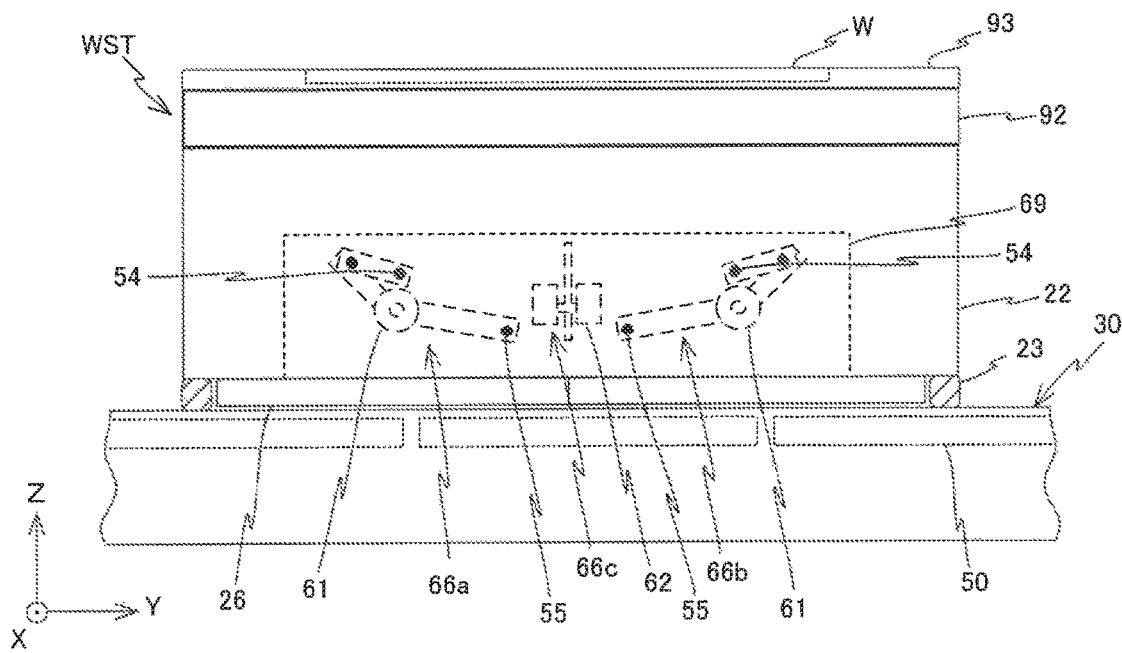
FIGS. 5A and 5B are views showing an example of a structure of a retracting device of an X driving wheel and Y driving wheels.

Inside wafer stage main section 22, as is shown in FIG. 5A, on one side and the other side of the center in the Y-axis direction, each of a pair of Y driving wheels 61 is retracted respectively, by retracting devices 66a, 66b. Further, inside wafer stage main section 22, at a position just about the center, an X driving wheel 62 is retracted by its retracting device 66c. Each of retracting devices 66a, 66b, and 66c consists of a four-bar linkage mechanism shown in, for example, FIG. 5A that is similar to a wheel retracting mechanism for aircrafts. For example, retracting device 66a of Y driving wheels 61 on the −Y side has a driving link which has one end attached to wafer stage main section 22 in a freely pivotable manner via a shaft 54, a driven link which has one end attached to wafer stage main section 22 in a freely pivotable manner via a shaft 55, and an intermediate link which couples the driving link and the driven link, via a joint. A rotary shaft of Y driving wheel 61 is supported in a freely pivotable manner by a member structuring the joint of the intermediate link and the driven link. A linkage mechanism of retracting device 66a changes between a state shown in FIG. 5A (a retracted state) and a state shown in FIG. 5B (a used state). For example, in the used state shown in FIG. 5B, the uppermost driving link is pressed against a stopper which is not shown. That is, a larding reaction force (grounding reaction force) of Y driving wheel 61 acts on this stopper. The linkage mechanism of retracting device 66a has a function in which movement is restricted by pressing a part of the driving link against the stopper, and the entire link is restricted in the case of receiving an external force. Further, when the driving link is driven clockwise in the drawing, the restriction is removed and the link is retracted. The following can be seen from FIGS. 5A and 5B. When Y driving wheel 61 lands, the driving link is pressed against the stopper by the reaction force, which restricts the linkage mechanism. This makes it possible to receive a load. After removing the load by the landing, the driving link is driven clockwise which lifts the driven link to which Y driving wheel 61 is attached, and by being folded retraction can be performed. In this mechanism, because the folding is performed after passing a dead point, space is required for Y driving wheel 61 to relatively extend downward instantaneously when passing the dead point. Other than the linkage mechanism described above, retracting device 66a is also equipped with a driving mechanism for the driving link which includes a driving motor.

Retracting device 66b of the other Y driving wheel 61 and retracting device 66c of the X driving wheel are also structured similarly to retracting devices 66a. Retracting devices 66a, 66b, and 66c (driving mechanisms of each driving link) is controlled individually by a control system (refer to FIG. 6). In the present embodiment, instructions to retracting devices 66a, 66b, and 66c are given from an external control system, via a controller 94 (refer to FIG. 6). As the external control system, for instance, a teaching pendant 64 is used (refer to FIG. 6) that is electrically connected to controller 94, and can be connected in a freely detachable manner to a connecter which is not shown provided at wafer stage main section 22.

Referring back to FIG. 4, on the lower surface of wafer stage main section 22, on both sides of the Y-axis direction on the outer side with two exhausting ports 73 in between, openings 56 and 57 are formed, respectively. These openings 56 and 57 are made to open/close by opening and shutting doors 63 and 64. Opening and shutting doors 63 and 64 are each gradually opened in conjunction with a transition of Y driving wheels 61 from the retracted state to the use state, and are each closed when a transition of Y driving wheels 61 from the used state to the retracted state is performed. That is, openings 56 and 57 are doorways of the two Y driving wheels 61.

Further, in the lower surface of wafer stage main section 22, an opening 58 is formed in between the two exhausting ports 73. Opening 58, similarly to the description above, is opened/closed by opening and shutting door 65, according to a transition of X driving wheel 62 between the retracted state and the used state.

Figure 5B:
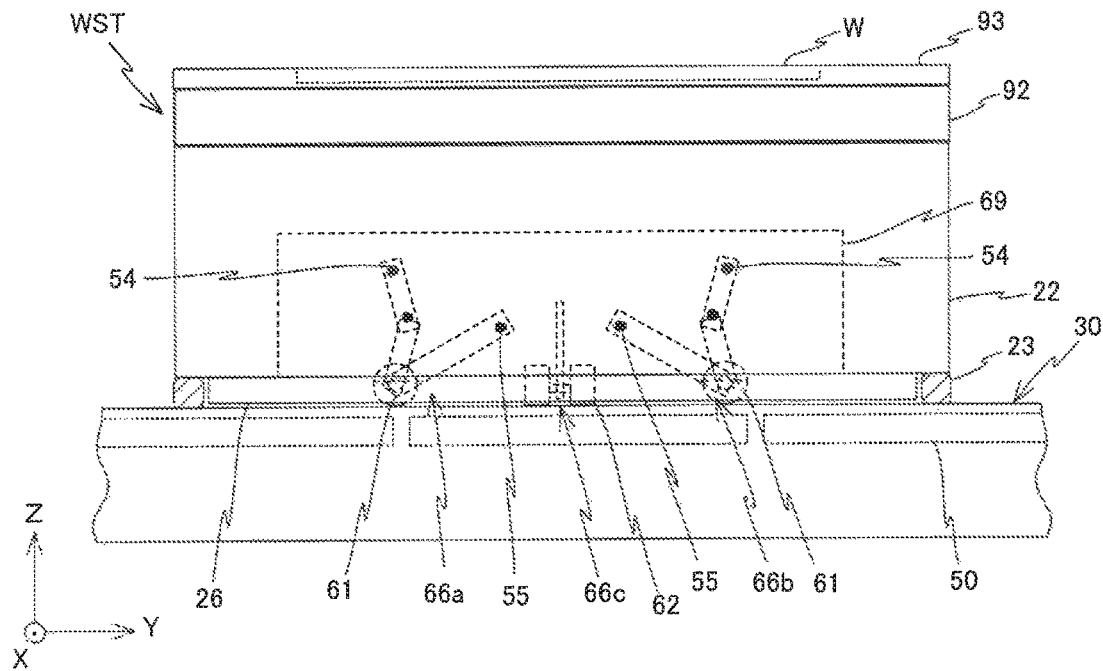

Incidentally, because a space above and below the lower surface (lower wall) of wafer stage main section 22 communicates with each other via openings 56, 57 or 58 when at least one of the three opening and shutting doors 63, 64, or 65 is opened, a partition wall 69 as is indicated by a dotted line in FIGS. 5A and 5B inside wafer stage main section 22 is provided so that the space where the retracting mechanism of wafer stage main section 22 is retracted structures an airtight chamber along with air chamber 72.

FIG. 6 shows a block diagram showing an input/output relation of main controller 90 which mainly structures a control system of exposure apparatus 10 and has overall control of each section. Main controller 90 includes a workstation (or a microcomputer) and the like, and has overall control of each section that structures exposure apparatus 10. Further, FIG. 6 also shows together an input/output relation of controller 94 inside wafer stage main section 22.

In exposure apparatus 10 having the structure described above, first of all, reticle R and wafer W are loaded on reticle stage RST and wafer stage WST, respectively, and then predetermined preparatory operations are performed, such as reticle alignment which uses reference marks on wafer stage WST not shown and a reticle alignment detection system not shown and the like, base line measurement of a wafer alignment detection system which is not shown, and wafer alignment (for example, EGA (Enhanced Global Alignment) and the like). Then, under the control of main controller 90, based on results of the wafer alignment (calculation results on array coordinates of a plurality of shot areas on wafer W), exposure by a step-and-scan method is performed, and the pattern of reticle R is transferred onto each of the plurality of shot areas on wafer W. In the exposure by the step-and-scan method, based on the results of the wafer alignment, wafer stage WST is moved to an acceleration starting position for exposure to the first shot area on wafer W, and reticle stage RST is driven so that the position of reticle R is at an acceleration starting position. Then, by reticle stage RST and wafer stage WST being synchronously driven along the Y-axis direction, exposure (scanning exposure) to the first shot area on wafer W is performed. Hereinafter, movement of wafer stage WST to the acceleration starting position for exposure of each shot area from the second shot onward on wafer W and exposure (scanning exposure) to each shot area is alternately repeated.

Now, for example, when the mother board which is not shown that distributes electric power, electric signal and the like used in coil unit 50 to each coil unit 50 malfunctions, and a desired driving of wafer stage WST is no longer possible by wafer stage driving system 27 (refer to FIG. 6) (when servo of planar motor 27 no longer works), to prevent damage of other parts, wafer stage WST is forcefully stopped, and wafer stage WST lands on surface plate 30. In the case wafer stage WST lands on surface plate 30 such as at the time of such an emergency stop or at the time of maintenance, that is, when driving (including levitation) of wafer stage WST cannot be performed by planar motor 27, wafer stage WST has to be moved to a predetermined position (a position where repairing can be performed) on surface plate 30 (or, on another support member at the same height as surface plate 30) for repair and the like.

Hereinafter, moving procedure of wafer stage WST in the case driving of wafer stage WST by wafer stage driving system 27 cannot be performed in exposure apparatus 10 related to the present embodiment will be described.

Incidentally, while moving of wafer stage WST is collaborative work performed by a plurality of workers, hereinafter, the workers are not distinguished individually and will simply be referred to as a worker.

First of all, the worker, as a pre-processing of moving wafer stage WST, connects one end of the piping member not shown to which the other end is connected to gas supply device 82 (not shown in FIG. 3, refer to FIG. 6) to pipeline 74 of wafer stage main section 22 as is shown in FIG. 3.

Incidentally, prior to this, predetermined preparatory operations are performed such as opening a panel that can be opened/closed of the environment control chamber not shown, setting a bottom board at the same height as surface plate 30 and the like.

Figure 7:
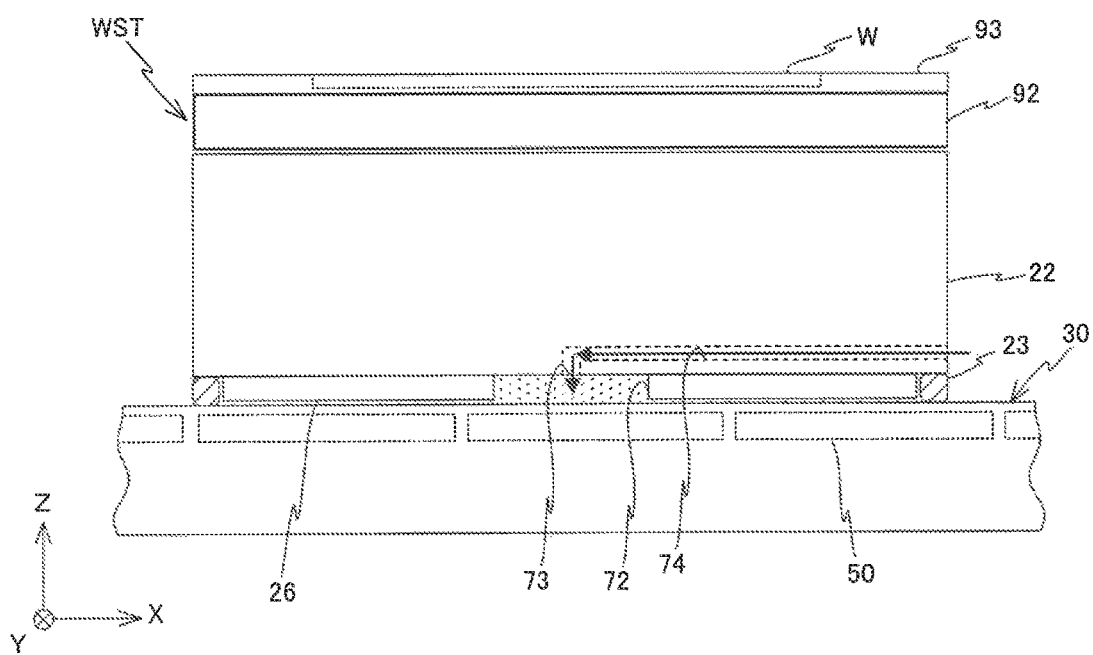
FIG. 7 is a view for describing a flow of pressurized gas sent into the wafer stage device from a gas supply device.

Next, the worker gives instructions from a main panel (not shown) of exposure apparatus 10 to start supplying air. In response to this instruction, main controller 90 starts to supply the high-pressure air from gas supply device 82. This makes the high-pressure air which is supplied blow out from the two exhausting ports 73 toward surface plate 30, via pipeline 74, as shown in FIG. 7.

In this case, air chamber 72 previously described which is in a substantially air-tight state from the outside is formed, in between wafer stage WST and surface plate 30.

Next, the worker connects a remote control device (teaching pendant) 64 (refer to FIG. 6) for operating retracting devices 66*a* and 66*b*, or 66*c* shown in FIG. 5A to a connecter section (not shown) which is provided at wafer stage main section 22 and is electrically connected to controller 94 of retracting devices 66*a* and 66*b*, 66*c*.

Next, the worker, for example, instructs driving of Y driving wheels 61 to an intermediate position to retracting devices 66*a* and 66*b*, via teaching pendant 64. Here, the intermediate position refers to a position where opening and shutting doors 63, 64 are opened halfway linked with Y driving wheels 61 being driven downward but Y driving wheels 61 are not exposed outside of wafer stage main section 22.

In response to the instructions described above, retracting devices 66*a* and 66*b* are controlled by controller 94 so that Y driving wheels 61 are driving from a retracting position (the position shown in FIG. 5A) to the intermediate position, and opening and shutting doors 63, 64 are opened halfway. This opening of opening and shutting doors 63, 64 allows air chamber 72 to communicate with the inner space of wafer stage main section 22, which forms a large sized airtight chamber as a whole.

In this case, the flow rate and the like of the high-pressure air sent from gas supply device 82 is controlled by flow rate control system 84 (refer to FIG. 6) described above so that an inner pressure of the airtight chamber becomes equal to or more than a predetermined value. Therefore, when a certain period of time passes after starting to supply the high-pressure air, the inner pressure in the airtight chamber including air chamber 72 becomes a positive pressure with respect to the external space, and (at least a part of) the weight of wafer stage WST is canceled.

Therefore, at the point when a certain period of time has passed after the start of supplying the high-pressure air, the worker, for example, instructs driving of Y driving wheels 61 to a landing position (a position shown in FIG. 5B), via teaching pendant 64. According to the instructions, retracting devices 66*a* and 66*b* are set to the landing state shown in FIG. 5B by controller 94, and Y driving wheels 61 are landed on the upper surface of surface plate 30. In this case, while a force responding to the reaction force of Y driving wheels 61 on landing acts on the upper surface of surface plate 30, because the weight of (at least a part of) wafer stage WST is cancelled by the inner pressure of the airtight chamber, the force acting on the upper surface of surface plate 30 via Y driving wheels 61 is small, which almost removes the possibility of the microchannel on the stator 50 side from being damaged.

Next, the worker manually pulls and/or pushes wafer stage WST in the Y-axis direction on surface plate 30. This makes the two Y driving wheels 61 rotate around the rotary shaft in the X-axis direction, and by the two Y driving wheels 61, wafer stage WST is guided in the Y-axis direction.

Here, for movement to a target position, in the case movement in the X-axis direction is necessary in addition to the movement in the Y-axis direction, the worker manually drives wafer stage WST in the X-axis direction on surface plate 30 in the following manner.

That is, the worker, for example, instructs Y driving wheels 61 to be retracted (or to be moved to the intermediate position) and X driving wheel 62 to be driven to a landing position, via teaching pendant 64 (refer to FIG. 6). According to the instructions, retracting devices 66*a* and 66*b* are controlled by controller 94 so that Y driving wheels 61 are retracted inside wafer stage main section 22 (or driven to the intermediate position of Y driving wheels 61) as shown in FIG. 5A, and X driving wheel 62 is landed on the upper surface of surface plate 30 as shown in FIG. 5B by retracting devices 66*c*. In this case, because (at least a part of) the weight of wafer stage WST is cancelled by the inner pressure of the airtight chamber, the force acting on the upper surface of surface plate 30 via X driving wheel 62 is small, which almost removes the possibility of the microchannel on the stator 50 side from being damaged.

Next, the worker manually pulls and/or pushes wafer stage WST in the X-axis direction on surface plate 30. This makes X driving wheel 62 rotate around the rotary shaft in the Y-axis direction, and by X driving wheel 62, wafer stage WST is guided in the X-axis direction. In this case, because a force of inertia in the horizontal direction acts on wafer stage WST, it is desirable to restrain the driving velocity of wafer stage WST immediately after starting and just before stopping the driving from a security perspective.

Incidentally, for movement to a target position, in the case movement only in the X-axis direction is necessary, the worker should manually drive wafer stage WST in the X-axis direction on surface plate 30, for example, after giving instructions on driving X driving wheel 62 to the landing position via teaching pendant 64 (refer to FIG. 6).

In any case, when wafer stage WST moves to a target position (a predetermined position), the worker gives instructions to stop the air supply from the main panel (not shown) of exposure apparatus 10. In response to the instructions, main controller 90 stops the supply of high-pressure air from gas supply device 82.

Around the time when the instructions described above are given to stop the air supply, the worker instructs retracting of Y driving wheels 61 and X driving wheel 62, via teaching pendant 64. According to the instructions, controller 94 controls retracting devices 66*a*, 66*b* and 66*c* so that the two X driving wheels 61 and Y driving wheel 62 are retracted in wafer stage main section 22, and openings 56, 57 and 58 are closed by opening and shutting doors 63, 64 and 65, respectively.

This makes the inside of air chamber 72 become the same pressure as the external space with the passage of time, and the entire weight of wafer stage WST becomes supported by surface plate 30, via frame-shaped member 23 (and mover 26).

In the case of returning wafer stage WST to its original position, by a reverse procedure of the description above, the worker should perform instructing via teaching pendant 64 and the main panel of exposure apparatus 10, and moving wafer stage WST manually. Further, after wafer stage WST is returned to its original position, the worker disconnects teaching pendant 64 from the connecter (not shown) provided at wafer stage main section 22 and also disconnects the connection of the piping member which is not shown to pipeline 74 of wafer stage main section 22.

As is described so far, according to the present embodiment, when wafer stage WST is landed on the upper surface of surface plate 30, in the case the worker gives instructions for air supply and landing of Y driving wheels 61 (or X driving wheel 62), main controller 90 forms an airtight chamber of positive pressure with respect to the space outside in the lower section and the inside of wafer stage main section 22 and controller 94 makes Y driving wheels 61 (or X driving wheel 62) land on the upper surface of surface plate 30. Therefore, the worker manually pulls or pushes wafer stage WST in a state where at least a part of the weight of wafer stage WST is canceled, which rotates Y driving wheels 61 (or X driving wheel 62) and guides wafer stage WST in the Y-axis direction (or the X-axis direction). Accordingly, even when generation of the driving force (levitation force) to wafer stage WST by planar motor 27 stops such as at the time of failure or maintenance and the like, the worker is able to move wafer stage WST manually on surface plate 30.

Incidentally, the structure and the like of exposure apparatus 10 related to the embodiment described above can be changed as appropriate. For example, in the embodiment above, while the piping member which connects gas supply device 82 and wafer stage main section 22 was connected to wafer stage main section 22 at the time of use and was disconnected when not in use, this arrangement was employed taking into consideration the point that position controllability of wafer stage WST will decrease when wafer stage WST drags the piping member. However, the embodiment is not limited to this, and a structure can be employed where the piping member is connected constantly to wafer stage WST.

Further, in the embodiment above, while instructions to start and stop air supply was given from the main panel of exposure apparatus 10, and instructions to retracting devices 66a, 66b, and 66c were given from teaching pendant 64, the present embodiment is not limited to this, and the instructions can both be given from the main panel of exposure apparatus 10 or from teaching pendant 64. Further, in the embodiment above, the description in the case of using teaching pendant 64 was made under the premise that teaching pendant 64 could be connected easily to wafer stage main section 22. However, in the case wiring connection of the teaching pendant to wafer stage main section 22 is expected to be difficult, a teaching pendant 64 can be used which is equipped with a wireless communication device that can perform wireless communication between controller 94 of retracting devices 66a, 66b, and 66c.

Further, in the embodiment above, a driving mechanism that includes a motor for driving the two Y driving wheels 61 and X driving wheel 62 can be provided, and this driving mechanism can be controlled by teaching pendant 64 via controller 94. That is, in addition to retracting devices 66a, 66b, and 66c, the two Y driving wheels 61 and X driving wheel 62 can be motorized. In such a case, because the force of inertia in the horizontal direction acts on wafer stage WST, from a security perspective, it is desirable to keep a low rotation speed of the two Y driving wheels 61 or X driving wheel 62 immediately after starting and just before stopping the driving, and to increase the rotation speed at other times. To achieve such speed control, it is desirable to have various kinds of sensors, such as, for example, a reflection type optical sensor or a Hall element sensor and the like provided on the movement path of wafer stage WST that can measure the position of wafer stage WST.

Incidentally, in the embodiment above, while two Y driving wheels 61 and one X driving wheel 62 were provided, the number of Y driving wheels 61 and X driving wheel 62 is not questioned in particular, if at least one each of Y driving wheel 61 and X driving wheel 62 is provided, then it would be convenient because wafer stage WST can be driven in XY two-dimensional directions. Further, in the embodiment above, while all driving wheels were retracted inside wafer stage main section 22 when the wheels were not used, the present embodiment is not limited to this, and a structure can be employed where at least one driving wheel is exposed outside at a predetermined position outside wafer stage main section 22 with the predetermined position serving as a retracting position when the wheels are not used, held at the retracting position outside wafer stage main section 22.

Further, in the embodiment above, while the case has been described where the pair of Y driving wheels 61 and X driving wheel 62 were made not to land simultaneously on surface plate 30, in the case when wafer stage WST is driven in an uniaxial direction by rotating one of the driving wheels around each axis, the pair of Y driving wheels 61 and X driving wheel 62 may be made to land simultaneously on surface plate 30 as long as a frictional force between the other driving wheel and the upper surface of surface plate 30 does not have an adverse effect on the movement of wafer stage WST.

Modified Example

Figure 8A:
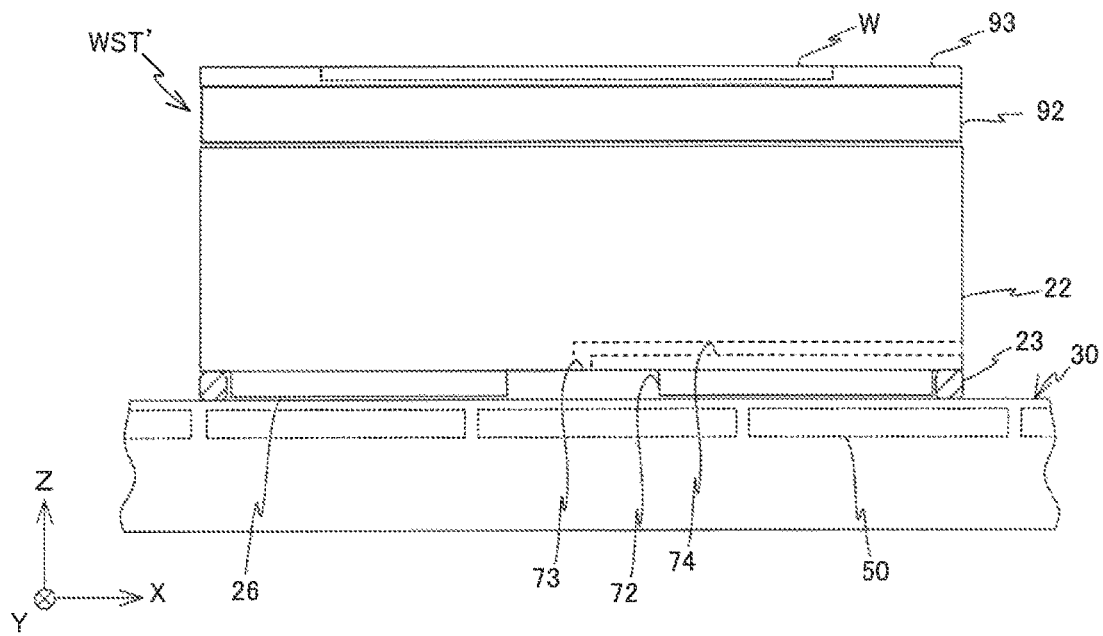
FIG. 8A is a side view of a wafer stage device related to a modified example.
Figure 8B:
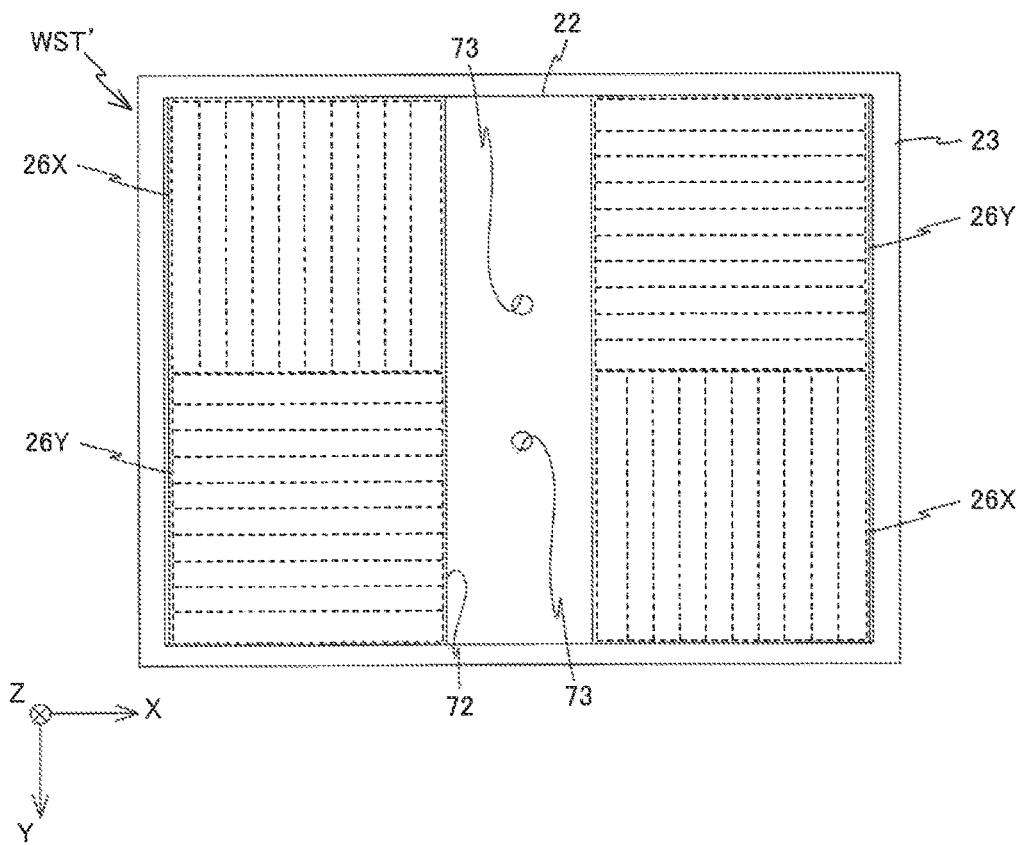
FIG. 8B is a bottom surface view of the wafer stage device related to the modified example.

Further, in the embodiment described above, while the case has been described where the pair of Y driving wheels 61 and X driving wheel 62 were provided, the driving wheels do not necessarily have to be provided. FIGS. 8A and 8B show a side view and a bottom surface view, respectively, of a wafer stage WST' related to a modified example in which driving wheels are not provided. In this case, as it can be seen from FIG. 8B, only two exhausting ports 73 are provided at the bottom surface of wafer stage main section 22, and there are no openings, opening and shutting doors and the like. However, as is shown in FIG. 8A, in the case wafer stage WST' lands on the upper surface of surface plate 30, air chamber 72 is formed. Therefore, pressurized gas (high-pressure air) is sent from gas supply device 82 into pipeline 74, and by making the pressurized gas blow out into air chamber 72 from exhausting port 73, the inside of air chamber 72 can be turned into positive pressure with respect to the space outside. This allows at least a part of the weight of wafer stage WST' to be canceled, and by the worker pulling and/or pushing wafer stage WST' in this state, wafer stage WST' can be moved manually on surface plate 30.

Figure 9:
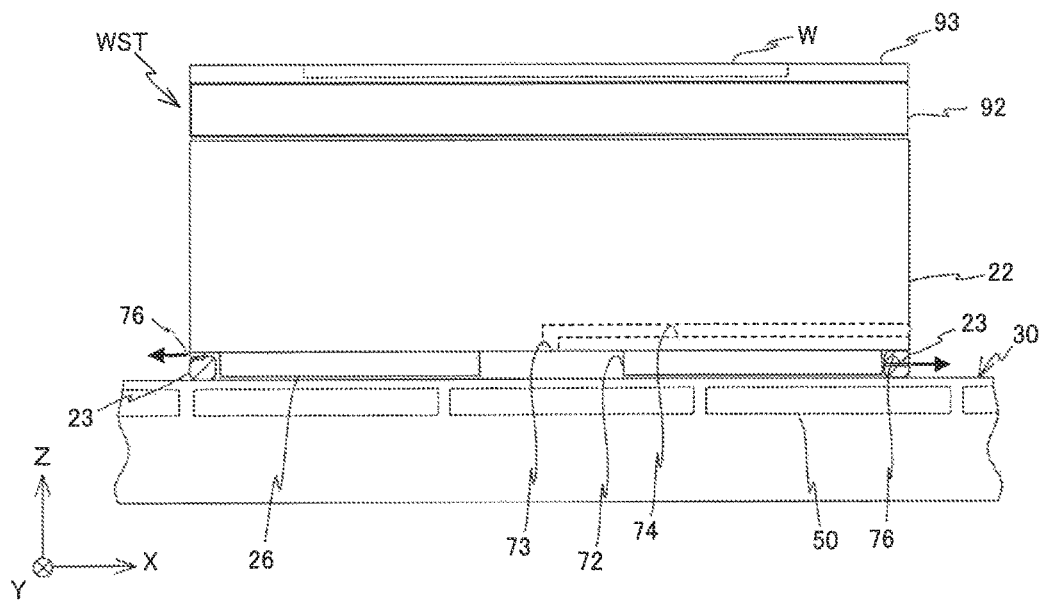
FIG. 9 is a side view of the wafer stage device that has an orifice hole formed in a frame-shaped member.

Incidentally, in the embodiment and the modified example described above, while air chamber 72 is completely closed (air-tight) by frame-shaped member 23 in a state where wafer stage WST (WST') has landed on surface plate 30, the embodiment is not limited to this, and for example, as is shown in FIG. 9, a plurality of through holes (hereinafter referred to as orifice holes 76) can be formed in wafer stage WST (WST') that communicates air chamber 72 with the external space. Orifice holes 76 can be formed in the center of a height direction of frame-shaped member 23 as is shown in a sectional view of frame-shaped member 23 positioned on the +X side of frame-shaped member 23 shown in FIG. 9, or can be formed on a boundary line of the upper end of frame-shaped member 23 and wafer stage main section 22 positioned on the −X side. Pressurized gas (high-pressure air) flows into air chamber 72 by gas supply device 82 (refer to FIG. 6), and when the inside of air chamber 72 becomes a positive pressure when compared with the external space, pressurized gas within air chamber 72 is exhausted to the external space from within air chamber 72 via the plurality of orifice holes 76. This can prevent a so-called pneumatic hammer phenomenon in which vibration occurs in an outer circumference section of wafer stage main section 22 and frame-shaped member 23.

Further, in the embodiment and the modified example described above, while pressurized gas (high-pressure air) was supplied from gas supply device 82 in a state where wafer stage WST (WST') has landed on surface plate 30, the embodiment is not limited to this, and the pressurized gas (high-pressure air) can be supplied into pipeline 74 furthermore when wafer stage WST (WST+) is driven on surface plate 30 by wafer stage driving system 27. That is, the pressurized gas (high-pressure air) can be supplied from gas supply device 82 even while wafer stage WST (WST') is being driven in directions of six degrees of freedom by planar motor 27. Especially when at least one orifice hole is provided at a part of the wafer stage, because the pressure within air chamber 72 is automatically adjusted to a predetermined value, supply of the pressurized gas (high-pressure air) from gas supply device 82 can be continued while wafer stage WST (WST') is being driven in directions of six degrees of freedom by planar motor 27. However, in this case, it is desirable that wafer stage WST does not move needlessly at times such as emergency stop due to the force of inertia, and is desirable for its countermeasures to be performed together if necessary.

Figure 10:
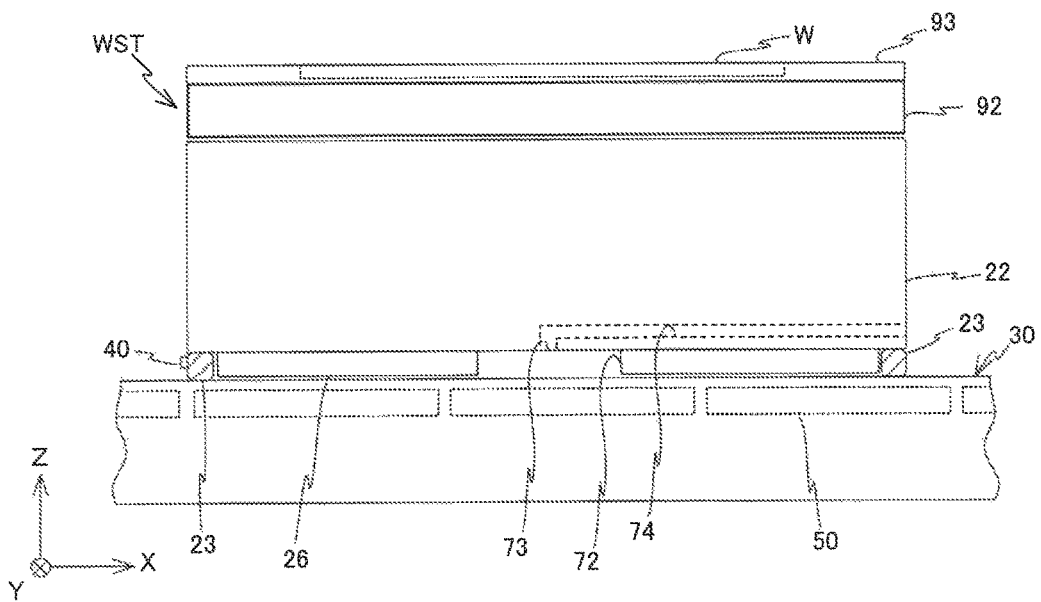
FIG. 10 is a side view of the wafer stage device which has a contact measuring system provided at an outer circumference section of the frame-shaped member.

Further, as is shown in FIG. 10, for example, a contact measuring system 40 consisting of a strain gauge or a pressure sensor and the like can be provided at the outer circumference section of frame-shaped member 23, and main controller 90 can detect the moment that frame-shaped member 23 lands on the upper surface of surface plate 30 from a change in measurement results of contact measuring system 40, and can immediately start supplying the pressurized gas from gas supply device 82. Further, in the embodiment and the modified example described above, while the case when two gas exhausting ports 73 were provided was described, the number of gas exhausting ports 73 can be one, three, or more.

Incidentally, illumination light IL is not limited to an ArF excimer laser beam (wavelength 193 nm), and can be ultraviolet light such as a KrF excimer laser beam (wavelength 248 nm), or a vacuum-ultraviolet light such as an $F_2$ laser beam (wavelength 157 nm). As is disclosed in, for example, U.S. Pat. No. 7,023,610, as the vacuum-ultraviolet light, a harmonic wave can be used which is obtained by amplifying a single wavelength laser beam in an infrared or visible range oscillated from a DFB semiconductor laser or a fiber laser, with a fiber amplifier doped with, for example, erbium (or both erbium and ytterbium) and performing wavelength conversion into an ultraviolet light using a non-linear optical crystal. Further, the wavelength of illumination light IL is not limited to light of 100 nm or more, and light having a wavelength of 100 nm or less can also be used, and the embodiment described above can also be applied, for example, to an EUV exposure apparatus which uses light an EUV (Extreme Ultraviolet) light in the soft X-ray area (for example, a wavelength region of 5 to 15 nm). Other than that, the embodiment above can also be applied to an exposure apparatus that uses a charged particle beam such as an electron beam or an ion beam.

Furthermore, the projection optical system in the exposure apparatus of the embodiment described above is not limited to a reduction system, and can either be an equal magnifying or a magnifying system, and projection optical system PL is not limited to a refractive system, and can either be a reflection system or a catadioptric system, and the projection image can either be an inverted image or an erected image.

Further, in each of the embodiments above, while a transmissive mask (reticle) on which a predetermined light shielding pattern (or a phase pattern or a light attenuation pattern) is formed on the transmissive substrate, was used, instead of this reticle, as is disclosed in, for example, U.S. Pat. No. 6,778,257, an electron mask (also called a variable shaped mask, an active mask, or an image generator, and includes, for example, a DMD (Digital Micro-mirror Device) which is a kind of a non-emission type image display device (spatial light modulator) and the like) which forms a light-transmitting pattern, a reflection pattern, or an emission pattern, based on electronic data of the pattern to be exposed can also be used.

Further, in each of the embodiments above, while a wafer stage device was described that has one wafer stage WST (WST') placed on surface plate 30, the number and the type of movable bodies placed on surface plate 30 can be appropriately changed, and the embodiment described above can also be applied to a wafer stage device equipped with two wafer stages as is disclosed in, for example, U.S. Patent Application Publication No. 2010/0066992, or a to wafer stage device as is disclosed in, U.S. Patent Application Publication No. 2009/0268178, which is equipped with a wafer stage and a measurement stage.

Furthermore, the embodiment described above can also be applied to a so-called liquid immersion exposure apparatus which performs exposure operation in a state where liquid (for example, pure water) is filled in between the projection optical system and the object subject to exposure (for example, wafer) as is disclosed in, for example, U.S. Pat. No. 8,004,650.

Further, the embodiment described above can also be applied to an exposure apparatus (lithography system) that forms a line-and-space pattern on wafer W by forming an interference fringe on wafer W, as is disclosed in PCT International Publication No. 2001/035168. Further, the embodiment described above can also be applied to a reduction projection exposure apparatus of a step-and-stitch method in which a shot area and a shot area are synthesized.

Furthermore, the embodiment described above can also be applied to an exposure apparatus which synthesizes two reticle patterns on a wafer via the projection optical system and performs double exposure almost simultaneously on a shot area on the wafer by performing scanning exposure once, as is disclosed in, for example, U.S. Pat. No. 6,611,316.

Further, the object on which the pattern should be formed (the object subject to exposure on which the energy beam is irradiated) in the embodiment above is not limited to the wafer, and may be other objects such as a glass plate, a ceramic substrate, a film member, or a mask blank.

Furthermore, the usage of the exposure apparatus is not limited to the exposure apparatus for manufacturing semiconductors and can be widely applied, for example, to an exposure apparatus for liquid crystals that transfers a liquid crystal display devices pattern onto a square-shaped glass plate, an exposure apparatus for manufacturing organic ELs, thin film magnetic head, an imaging element (such as a CCD), a micromachine and a DNA chip and the like. Further, the embodiment described above can also be applied to an exposure apparatus that transfers a circuit pattern onto a glass substrate or a silicon wafer for manufacturing not only microdevices such as semiconductor devices but also a reticle or a mask that is used in an optical exposure apparatus, and EUV exposure apparatus, an X-ray exposure apparatus, an electron beam exposure apparatus and the like.

Electronic devices such as semiconductor devices are manufactured through steps such as; a step for performing function/performance design of a device, a step for making a reticle based on the design step, a step for making a wafer from a silicon material, a lithography step for transferring a pattern of a mask (reticle) onto the wafer by the exposure apparatus (pattern formation apparatus) and the exposure method related to the embodiment previously described, a development step for developing the wafer which has been exposed, an etching step for removing by the etching an exposed member of an area other than the area where the resist remains, a resist removing step for removing the resist that is no longer necessary since etching has been completed, a device assembly ep (including a dicing process, a bonding process, and a package process), and an inspection step. In this case, in the lithography step, because the device pattern is formed on the wafer using the exposure apparatus of the embodiment described above in the exposure method previously described, a highly integrated device can be manufactured with good productivity.

Further, the exposure apparatus (pattern formation apparatus) of the embodiment described above is manufactured by assembling various kinds of subsystems that include the respective constituents which are recited in the claims of the present application so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the PCT International Publications, the U.S. Patent Application Publications and the U.S. Patents that are cited in the description so far related to exposure apparatuses and the like are each incorporated herein by reference.

INDUSTRIAL APPLICABILITY

As is described so far, the movable body apparatus of the present invention is suitable for driving the movable body on a base member. Further, the exposure apparatus of the present invention is suitable for forming a predetermined pattern on an object. Further, the device manufacturing method of the present invention is suitable for producing microdevices.

The invention claimed is:

1. A movable body apparatus, comprising:
a base member;
a movable body that is movable on the base member;
a planar motor of a magnetic levitation method that moves the movable body on the base member, the planar motor having a stator provided at the base member and a mover provided at the movable body, and supporting in a non-contact manner the movable body above the base member by a magnetic levitation force generated by electromagnetic interaction between the stator and the mover; and
a support apparatus different from the planar motor, and capable of supporting the movable body above the base member, the support apparatus being capable of generating a support force with respect to the movable body at least at a non-generating time of the magnetic levitation force.

2. The movable body apparatus according to claim 1, wherein
the movable body is levitated by the support force.

3. The movable body apparatus according to claim 2, wherein
the movable body levitated by the support force is spaced apart from the base member.

4. The movable body apparatus according to claim 3, wherein
the support apparatus supports at least a part of a weight of the movable body by the support force caused by a positive pressure of a pressurized gas.

5. The movable body apparatus according to claim 4, wherein
the positive pressure is created by blowing out the pressurized gas toward the base member.

6. An exposure apparatus, comprising:
the movable body apparatus according to claim 1 in which a predetermined object is held by the movable body; and
a pattern formation apparatus which forms a predetermined pattern by irradiating the object with an energy beam.

7. A device manufacturing method, comprising:
exposing the object using the exposure apparatus according to claim 6; and
developing the object that has been exposed.

8. An exposing method, comprising:
moving a predetermined object held by the movable body in the movable body apparatus according to claim 1; and
forming a predetermined pattern by irradiating the object with an energy beam.

9. A moving method, comprising:
placing a movable body on a base member so that the movable body is movable on the base member by a planar motor of a magnetic levitation method that moves the movable body on the base member, the planar motor having a stator provided at the base member and a mover provided at the movable body, and supporting in a non-contact manner the movable body above the base member by a magnetic levitation force generated by electromagnetic interaction between the stator and the mover; and supporting the movable body above the base member with a support force generated by a support apparatus different from the planar motor, the support apparatus being capable of generating the support force at least at a non-generating time of the magnetic levitation force.

10. The moving method according to claim 9, wherein supporting the movable body comprises causing the movable body to levitate.

11. The moving method according to claim 10, further comprising:
   moving the movable body that is levitated, parallel to a surface of the base member.

12. The moving method according to claim 11, further comprising:
   moving the movable body that is levitated, to a predetermined position where repairing can be performed.

13. The moving method according to claim 12, wherein the predetermined position is on the surface of the base member or on another support member at the same height as the surface of the base member.

* * * * *